United States Patent [19]

Sereda et al.

[11] Patent Number: 5,494,845
[45] Date of Patent: Feb. 27, 1996

[54] METHOD OF FABRICATION OF BILAYER THIN FILM RESISTOR

[75] Inventors: Michael W. Sereda, San Francisco, Calif.; Zenon Zubrycky, Los Gatos, both of Calif.

[73] Assignee: Raytheon Company, Lexington, Mass.

[21] Appl. No.: 108,943

[22] Filed: Aug. 17, 1993

[51] Int. Cl.[6] .................................................. H01L 21/70
[52] U.S. Cl. ............................ 437/60; 437/245; 437/246; 437/192
[58] Field of Search .................................. 437L/60, 245, 437L/246, 247, 192

[56] References Cited

U.S. PATENT DOCUMENTS

| 3,607,384 | 7/1968 | Banks . |
| 3,996,551 | 12/1976 | Croson . |
| 4,454,495 | 6/1984 | Werner et al. . |
| 4,766,411 | 8/1988 | Prieto et al. . |
| 5,221,639 | 6/1993 | White . |

OTHER PUBLICATIONS

"$TiN_xO_y$ as a Barrier Between Cr–Si–(O) and Aluminum Thin Films" K.–H. Bather, et al. *Thin Solid Films* 200 (1991) pp. 93–116.

Primary Examiner—Olik Chaudhuri
Assistant Examiner—C. Everhart
Attorney, Agent, or Firm—William R. Clark

[57] ABSTRACT

A bilayer thin film resistor and a method of fabricating such as resistor. A layer of a resistive material such as titanium tungsten is sputter deposited on a substrate before depositing a relatively thick overlayer of a material such as chromium silicon monoxide to form a bilayer resistor. Whereas the sheet resistance of a chromium silicon monoxide layer by itself would be relatively unpredictable and unreproducible, the sheet resistance and the uniformity of the bilayer can be accurately controlled by making small adjustments to the scan rate of the titanium tungsten to control the thickness of the underlayer. Optionally, the titanium tungsten underlayer can be sputter etched to increase to sheet resistance of the bilayer, and also to increase heat stability so as to decrease the drop in sheet resistance during subsequent thermal processing.

17 Claims, 2 Drawing Sheets

METHOD OF FABRICATION OF BILAYER THIN FILM RESISTOR

BACKGROUND OF THE INVENTION

The field of the invention generally relates to semiconductor devices, and more particularly relates to thin film resistors and a method of fabricating thin film resistors.

As is well known, integrated circuits and thin film devices frequently require resistors as part of the circuitry, and thin film resistors are commonly used. Thin film resistors generally consist of a thin film of resistive material deposited such as by sputter deposition on a layer or substrate of insulative material with end contacts on the resistive material. The end contacts or interconnections are then connected to circuit components in conventional manner.

As is well known, thin film resistors desirably have a number of characteristics. For example, it is generally desirable that a thin film resistor have at least a minimum thickness in order to handle specified current densities during operation; the thickness should also be relatively uniform. It is also desirable that a thin film resistor have a target or intended resistance commonly expressed as sheet resistance in ohms per square. Further, it is normally desirable that a thin film resistor have a very low temperature coefficient of resistance, or at least a temperature coefficient of resistance that is suitably matched to a particular application. For example, it may be desirable to have a temperature coefficient of resistance that is either positive or negative. Temperature coefficient of resistance is a measure of how the sheet resistance varies with temperature. Therefore, a thin film resistor with a zero coefficient of resistance theoretically does not vary in resistance as the temperature changes. As an example, it may be desirable to fabricate thin film resistors having a sheet resistance in the range from 1000 to 10,000 ohms per square with a temperature coefficient of resistance less than 50 parts per million.

Some materials such as chromium silicon monoxide can be deposited such as by sputter deposition to form high resistance films that have relatively low temperature coefficients of resistance. However, the sheet resistances may generally be unreproducible. For example, integrated circuits are typically thermally processed such as for annealing. As is known, raising the temperature of a thin film resistor normally forms a crystalline structure and the sheet resistance decreases. Therefore, it may be necessary to provide a higher than desired sheet resistance knowing that it will decrease during subsequent thermal processing. However, with certain materials such as chromium silicon monoxide, the sheet resistance may fall dramatically and unpredictably during thermal processing before the integrated circuit is packaged. Therefore, without accurately knowing how much the sheet resistance will fall, it may not be possible to set a sheet resistance during the deposition stage of fabrication so as to arrive at a target or intended sheet resistance later during the fabrication of the integrated circuit. In any event, the yield of such thin film resistors having a specified or target sheet resistance may be very low.

Further, the uniformity of a thin film resistor made of a material such as CrSiO may typically be in the range from 5-15%, and may not be repeatable from run to run. This factor also contributes to the unpredictability of sheet resistance.

SUMMARY OF THE INVENTION

In accordance with the invention, a method of fabricating a bilayer thin film resistor comprises the steps of selecting a thickness of a first layer of a first resistive material to provide a predetermined sheet resistance for the bilayer thin film resistor, and depositing a second resistive material on the first layer to form a second layer of the bilayer thin film resistor with the thickness of the second layer being substantially greater than the thickness of the first layer. It may be preferable to also include a step of sputter etching the first layer before depositing the second layer. In a preferred embodiment, the first resistive material comprises titanium tungsten with a thickness of approximately 10 angstroms, and the second resistive material comprises chromium silicon monoxide with a thickness in the range from 100 to 200 angstroms. A sacrificial cap layer such as titanium tungsten with a thickness of about 300 angstroms may also be deposited to protect the bilayer resistor during subsequent patterning by wet etching.

The invention may also be practiced by a bilayer thin film resistor comprising a first layer of first resistive material having a thickness predominantly controlling the sheet resistance for the bilayer thin film resistor and a second layer of second resistive material deposited on the first resistive layer wherein the second layer is substantially thicker than the first layer.

With such method and arrangement, the sheet resistance of thin film resistors can be accurately controlled by including an underlayer of a resistive material such as titanium tungsten. More particularly, with certain materials such as chromium silicon monoxide, sheet resistance is unreproducible from run to run, largely because of the unpredictability in sheet resistance drop during subsequent thermal processing. However, by including a relatively thin underlayer such as titanium tungsten to form a bilayer thin film resistor, the sheet resistance of the bilayer can be accurately controlled by regulating the thickness of the underlayer. So long as the chromium silicon monoxide has at least a minimum thickness, varying that thickness will have very little effect on the sheet resistance of the bilayer. Further, a minimum thickness of the chromium silicon monoxide layer may be advantageous to provide a predetermined current density during operation. In contrast, small changes in the thickness of the titanium tungsten underlayer will have great effect on the sheet resistance of the bilayer. That is, the sheet resistance of the bilayer is predominantly controlled by the thickness of the titanium tungsten underlayer. The titanium tungsten can be sputter deposited to a precise thickness by suitably adjusting the scan rate during sputter deposition. Further, the uniformity of the bilayer is largely controlled or determined by the uniformity of the titanium tungsten underlayer. The optional sputter etching of the titanium tungsten underlayer serves to increase the sheet resistance, and also increases the heat stability so that the drop in sheet resistance during thermal processing is smaller and more predictable.

BRIEF DESCRIPTION OF THE DRAWINGS

The foregoing objects and advantages will be more fully understood by reading the following Description of the Preferred Embodiment with reference to the drawings wherein.

DESCRIPTION OF THE PREFERRED EMBODIMENT

Figure 1:
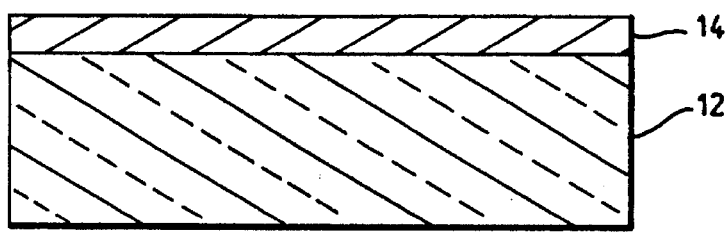
FIGS. 1–3 show various stages in the fabrication of a bilayer thin film resistor.
Figure 2:
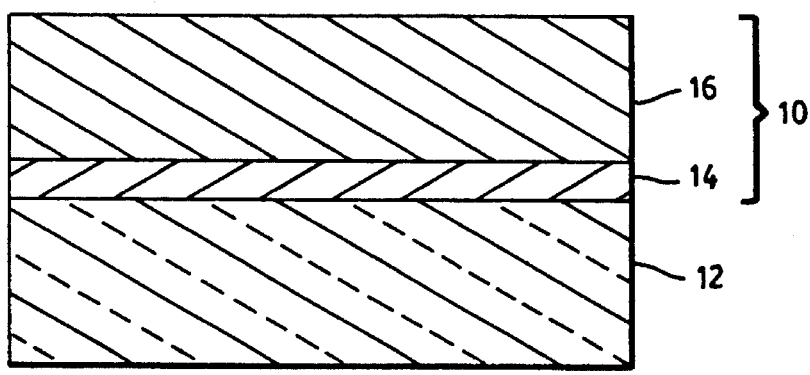
Figure 3:
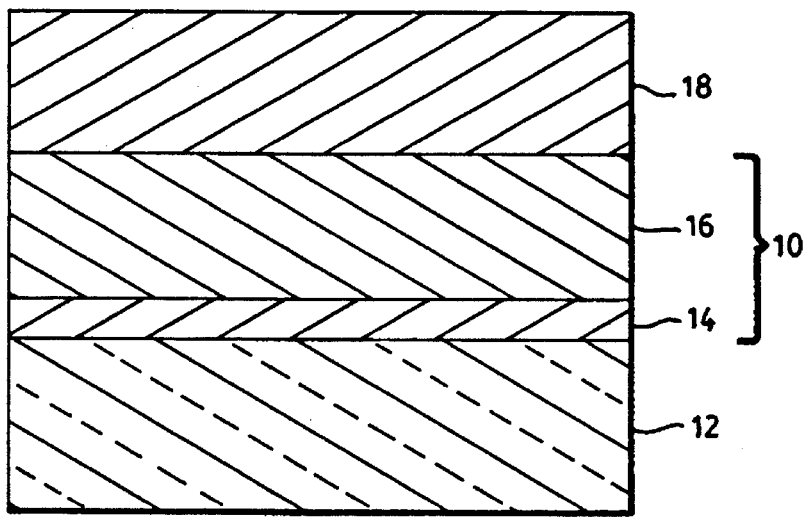

Referring to FIGS. 1–3, sequential stages or steps in a fabrication process for a bilayer thin film resistor 10 or bilayer are shown. More specifically, FIG. 1 shows a substrate 12 such as a silicon wafer or an insulative oxide layer on which underlayer 14 of resistive material is disposed. As an example, underlayer 14 may preferably consist of titanium or titanium tungsten (TiW) deposited on substrate 12 using sputter deposition to a thickness of 10 angstroms. Many other resistive materials such as polysilicon or platinum could also be used.

Optionally, underlayer 14 may be sputter etched following deposition. For example, the TiW underlayer 14 may be sputter etched using 100 watts for fifteen seconds. Such processing would not reach an activation level that would cause material to be removed. Rather, an optional sputter etching step under such conditions serves to heat up the TiW layer 14 and provide stabilization. More specifically, bilayer thin film resistor 10 conventionally becomes part of an integrated circuit and is subsequently thermally treated such as for an annealing process in which the temperature may typically be raised to a high temperature such as to 490 degrees centigrade for approximately 30 minutes. The heating of bilayer thin film resistor 10 forms a crystalline structure, and also reduces the sheet resistance of resistor 10. The optional step of sputter etching underlayer 14 serves to increase the heat stability of bilayer thin film resistor 10. For example, without sputter etching underlayer 14, the sheet resistance might drop from 2100 to 900 ohms per square during thermal processing. However, with the sputter etching step, the sheet resistance might drop from 1800 to only 1500 ohms per square. Thus, sputter etching enables higher sheet resistances to be attained, and also may improve the predictability of how much the sheet resistance will drop. Therefore, more accurate sheet resistances may be achieved. It follows that there may be an advantage to sputter depositing underlayer 14 and then sputter etching.

Referring to FIG. 2, the next step in the fabrication process is to deposit the second or top layer 16 of material that, along with underlayer 14, makes up or forms the bilayer thin film resistor 10. If underlayer 14 is sputter etched, underlayer 14 may be relatively unstable; thus, it may be desirable to cover underlayer 14 with top layer 16 relatively quickly. Although other materials could be used, top layer 16 is here chromium silicon monoxide (CrSiO) sputter deposited to a thickness in the range from 150–200 angstroms. As an example, the chromium may make up 50–75% by weight of the chromium silicon monoxide. As will be discussed later, the thickness of top layer 16 may be selected to provide predetermined or target current densities during operation.

Referring to FIG. 3, the next step is to deposit a sacrificial cap layer 18 of a material such as TiW. For example, when the bilayer thin film resistor 10 is to be defined by subsequent masking and wet etching steps using a formulation such as hydrogen peroxide, the cap layer 18 serves to protect the bilayer thin film resistor 10. In particular, cap layer 18 may typically be deposited to a thickness of 300 angstroms. Thus, during the formation of aluminum pads (not shown) using conventional masking and etching techniques, an etching formulation such as hydrogen peroxide removes much of the TiW in the sacrificial cap layer 18, but the bilayer 10 is protected.

Figure 4:
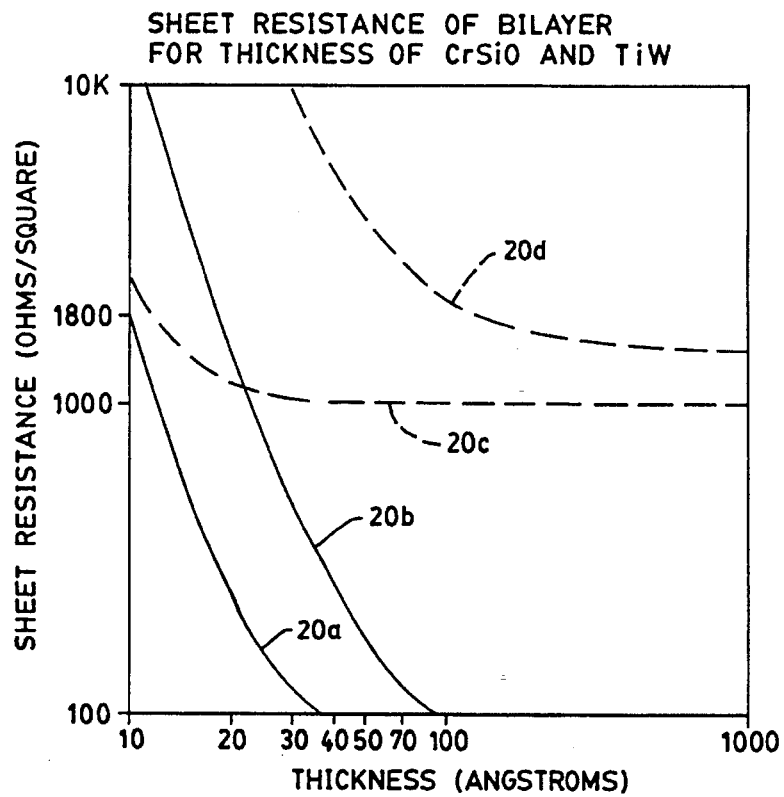
FIG. 4 shows logarithmic plots of the relationships between sheet resistance of the bilayer thin film resistor and the respective thickness of the individual layers.

Referring to FIG. 4, respective plots 20a–d show the sheet resistance of bilayer 10, as deposited, for different thicknesses of the TiW underlayer 14 and the CrSiO overlayer 16. More specifically, plots 20a and b show how the sheet resistance in ohms per square of bilayer 10 varies as a function of the thickness of the TiW layer 14 while holding the thickness of the CrSiO layer 16 constant, here at 150 angstroms. The data for plots 20a and b were taken after sputter etching the TiW underlayer 14 for fifteen minutes with 100 watts and 200 watts, respectively. As can be seen, for a given thickness of the TiW layer 14, the sheet resistance of the bilayer 10 is here increased by increasing the wattage of the sputter etching.

Still referring to FIG. 4, plots 20c and d respectively show how the sheet resistance in ohms per square of bilayer 10 varies as a function of the thickness of the CrSiO layer 16. In particular, for plot 20c, the TiW underlayer 14 was deposited to a thickness of 8 angstroms and, without sputter etching, various thicknesses of the CrSiO layer 16 were deposited to determine the effect on the sheet resistance of the bilayer 10. For plot 20d, the TiW underlayer 14 was deposited to a thickness of 10 angstroms and then sputter etched for 15 minutes at 100 watts for various thicknesses of the CrSiO layer 16.

The graph of FIG. 4 is logarithmic, and shows that the sheet resistance in ohms per square of the bilayer 10 can be made to vary dramatically with relatively small changes in the thickness of the TiW underlayer 14. For example, with a 100 watt sputter etching as shown by plot 20a, the sheet resistance of the bilayer 10 can be raised from approximately 100 to 1800 ohms per square by reducing the thickness of the TiW layer 14 from approximately 40 to 10 angstroms. In contrast, for the sputter etched data of plot 20d, it can be seen that for thicknesses of the CrSiO layer 16 above approximately 100 angstroms, the sheet resistance of the bilayer 10 changes very slowly for increases in thickness. Further, when the TiW underlayer 14 is not sputter etched, the sheet resistance of the bilayer 10 does not vary much as the CrSiO layer is increased from approximately 25 angstroms.

In accordance with the invention, it has been determined that the intended or target sheet resistance of the bilayer 10 can be set or controlled by suitably selecting the thickness for the TiW underlayer 14. Further, the thickness above a predetermined minimum for the CrSiO layer 16 has little effect on the sheet resistance of the bilayer 10, so the CrSiO layer 16 can be made relatively thick such as, for example 150 angstroms, to enable relatively high current densities during operation. Thus, while the sheet resistance of a CrSiO layer 16 by itself would be very unpredictable, the addition of a relatively thin TiW underlayer 14 can be used to provide relatively high sheet resistances that are accurately controlled and predictable.

Figure 5:
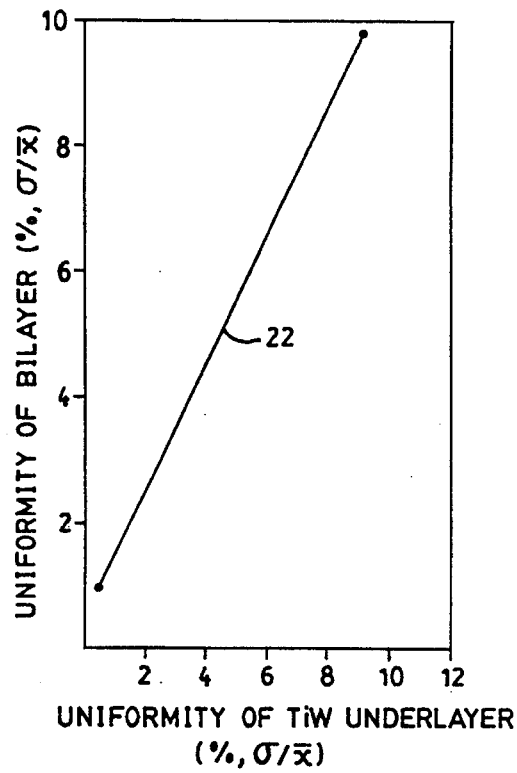
FIG. 5 show a plot of the relationship between the uniformity of the bilayer and the uniformity of the TiW underlayer expressed as a percent of the standard deviation over the mean.

Referring to FIG. 5, plot 22 shows the relationship between the uniformity of the bilayer 10 versus the uniformity of the TiW layer 14 expressed in percentage standard deviation $\sigma$ divided by the mean $\bar{x}$. As can be seen, another advantage of the TiW underlayer 14 is that it also can be used to control uniformity of the bilayer 10. For example, the uniformity of the TiW layer 14 can be deposited at about 2% or less thereby resulting in a uniformity of sheet resistance of the bilayer 10 of approximately 2%. Using shutters, the TiW underlayer 14 may be deposited at about 1%. In contrast, the uniformity of the CrSiO layer 16, which typically is in the range 5–15% and difficult to repeat, has very little effect on the uniformity of the bilayer 16. As stated, the bilayer 16 uniformity is instead predominantly determined by the uniformity of the TiW layer 14.

The temperature coefficient of resistance for bilayer 10 depends on or is controlled largely by the chromium concentration in the CrSiO layer 16. In particular, with chromium making up from 50–75% by weight of the CrSiO, the temperature coefficient of resistance is near zero.

Although the principles of the invention can be used to advantage with a variety of different parameters and materials, one example is to sputter deposit a layer 14 of titanium tungsten (TiW) to a thickness of approximately 10 angstroms using a DC bias. The layer 14 is then sputter etched for 15 seconds using 100 watts. With reference to plot 2a of FIG. 4, such step sets the sheet resistance of the subsequently formed bilayer 10 to approximately 1800 ohms per square. The sheet resistance could be made higher by either sputter etching with more power such as 200 watts as shown in plot 2b, or making the thickness of the TiW layer 14 less. However, thicknesses less than 10 angstroms may tend to be unstable. The thickness of the TiW layer 14 is easily controlled by small changes in deposition parameters. For example, small adjustments of the scan rate can accurately control the thickness during sputter deposition, and small changes in thickness can be used to accurately control the sheet resistance as shown by plots 2a and b. Further, the uniformity of the TiW layer 14 can be accurately controlled.

In the next step, chromium silicon monoxide (CrSiO), which is 50–75% chromium by weight, is sputter deposited to a thickness of 150 angstroms. CrSiO is an insulator, and therefore is deposited under an RF bias to avoid arcing and charging up. With an RF bias, the deposition is relatively slow. As discussed, the thickness and uniformity of the CrSiO layer 16 are not critical in determining the sheet resistance and uniformity of the bilayer 10. Both of these parameters are predominantly controlled by the TiW underlayer 14.

The optional step of sputter etching the TiW layer 14 not only raises the sheet resistance of the bilayer 10 as deposited, but also increases the thermal stability thereby resulting in a smaller decrease in sheet resistance when subsequently heated during an unrelated thermal process. In particular, the sputter etching causes the sheet resistance during thermal processing to be reduced from approximately 1800 to 1500 ohms per square, a decrease of about 15%. Without sputter etching, a sheet resistance of 2100 ohms per square might be reduced to 900, a decrease of approximately 58%.

In summary, sheet resistance and uniformity are very difficult if not impossible to predict or control with a thin film resistor consisting of a single layer of material such as CrSiO. However, by adding a relatively thin underlayer 14 such as TiW to form a bilayer thin film resistor 10, sheet resistance and uniformity are accurately controlled and predictable by suitably selecting the thickness of the TiW layer 14. The thickness and uniformity of the TiW underlayer 14 can be accurately controlled by small adjustments to the scan rate during sputter deposition. Also, an optional sputter etching step to the TiW underlayer 14 enables higher sheet resistances to be attained, and increases heat stability so that there is less of a drop in sheet resistance during subsequent thermal processing.

This concludes the description of the preferred embodiment. A reading of it will bring to mind many alterations and modifications that do not depart from the spirit and scope of the invention. Therefore, it is intended that the scope of the invention be limited only by the appended claims.

What is claimed is:

1. A method of fabricating a bilayer thin film resistor, comprising the steps of:

selecting a thickness of a first layer of a first resistive material comprising titanium to set the sheet resistance for the bilayer thin film resistor;

depositing the first resistive material on an insulative substrate to form a first layer having the selected thickness; and depositing a second resistive material on the first layer to form a second layer of the bilayer thin film resistor with the thickness of the second layer being larger than the thickness of the first layer to enable the bilayer thin film resistor to operate with high current densities.

2. The method recited in claim 1 further comprising the steps of sputter depositing the first layer of the first resistive material and then sputter etching the first layer.

3. The method recited in claim 1 further comprising the steps of sputter depositing the first layer of the first resistive material and adjusting the scan rate of the sputter depositing to set the thickness of the first layer.

4. The method recited in claim 1 further comprising the step of heating the first and second layers thereby causing reduction of the sheet resistance of the bilayer as deposited.

5. The method recited in claim 1 wherein the first resistive material comprises titanium.

6. A method of fabricating a bilayer thin film resistor, comprising the steps of:

selecting a thickness of a first layer of a first resistive material to provide a sheet resistance for the bilayer thin film resistor.;

depositing the first resistive material on a substrate to form a first layer having the selected thickness;

depositing a second resistive material on the first layer to form a second layer of the bilayer thin film resistor with the thickness of the second layer being larger than the thickness of the first layer; and wherein the first resistive material comprises titanium tungsten.

7. A method of fabricating a bilayer thin film resistor, comprising the steps of:

selecting a thickness of a first layer of a first resistive material to provide a sheet resistance for the bilayer thin film resistor;

depositing the first resistive material on a substrate to form a first layer having the selected thickness;

depositing a second resistive material on the first layer to form a second layer of the bilayer thin film resistor with the thickness of the second layer being larger than the thickness of the first layer; and wherein the thickness of the first layer is approximately 10 angstroms.

8. The method recited in claim 6 wherein the second resistive material comprises chromium.

9. The method recited in claim 8 wherein the second resistive material comprises chromium silicon monoxide.

10. The method recited in claim 7 wherein the thickness of the second layer is in the range from 100 to 200 angstroms.

11. The method recited in claim 10 further comprising a step of depositing a cap layer over the second layer.

12. A method of fabricating a bilayer thin film resistor, comprising the steps of:

selecting a thickness of a first layer of a first resistive material comprising titanium to provide a sheet resistance for the bilayer thin film resistor;

depositing the first resistive material on a substrate to form a first layer having the selected thickness;

depositing a second resistive material on the first layer to form a second layer of the bilayer thin film resistor with the thickness of the second layer being larger than the thickness of the first layer; and depositing a cap layer over the second layer wherein the cap layer comprises titanium.

13. The method recited in claim 12 wherein the cap layer comprises titanium tungsten.

14. The method recited in claim 13 wherein the cap layer has a thickness of approximately 300 angstroms.

15. A method of fabricating a bilayer thin resistor having first and second layers, comprising the steps of:

depositing a first resistive material to form the first layer with the thickness selected to set the sheet resistance for the bilayer thin film resistor;

sputter etching the first layer before depositing the second layer to increase the sheet resistance and heat stability of the bilayer resistor; and depositing a second resistive material over the first layer to form the second layer with a thickness greater than the thickness of the first layer, the thickness of the second layer being selected without regard to the affect on the sheet resistance of the bilayer thin film resistor.

16. A method of fabricating a bilayer thin film resistor having first and second layers, comprising the steps of:

depositing a first resistive material to form the first layer with the thickness selected to set the sheet resistance for the bilayer thin film resistor;

depositing a second resistive material over the first layer to form the second layer with a thickness greater than the thickness of the first layer, the thickness of the second layer being selected without regard to the affect on the sheet resistance of the bilayer thin film resistor; and wherein the first resistive material comprises titanium tungsten and the second resistive material comprises chromium silicon monoxide.

17. A method of fabricating a bilayer thin film resistor having first and second layers, comprising the steps of:

depositing a first resistive material to form the first layer with the thickness selected to set the sheet resistance for the bilayer thin film resistor;

depositing a second resistive material over the first layer to form the second layer with a thickness greater than the thickness of the first layer, the thickness of the second layer being selected without regard to the affect on the sheet resistance of bilayer thin film resistor; and wherein the first layer is selected to have a thickness of approximately 10 Å, and the second layer is selected to have a thickness in the range from 100 to 200 Å.

* * * * *